(12) United States Patent
Wiederhold et al.

(10) Patent No.: US 11,234,345 B2
(45) Date of Patent: Jan. 25, 2022

(54) DATA CENTER HAVING A DIFFERENTIAL PRESSURE RELIEF MECHANISM BETWEEN COLD AND HOT AISLES

(71) Applicant: DELL PRODUCTS, L.P., Round Rock, TX (US)

(72) Inventors: Trey S. Wiederhold, Cedar Park, TX (US); Anthony P. Middleton, Cedar Park, TX (US); Tyler B. Duncan, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/685,908

(22) Filed: Nov. 15, 2019

(65) Prior Publication Data
US 2021/0153388 A1    May 20, 2021

(51) Int. Cl.
*H05K 7/20* (2006.01)

(52) U.S. Cl.
CPC ....... *H05K 7/20709* (2013.01); *H05K 7/2049* (2013.01); *H05K 7/20127* (2013.01)

(58) Field of Classification Search
CPC .................. H05K 7/20709; H05K 7/20745
See application file for complete search history.

(56) References Cited

U.S. PATENT DOCUMENTS

| | | | | |
|---|---|---|---|---|
| 4,384,672 A | * | 5/1983 | Kutzner | F23L 13/02 126/292 |
| 5,915,960 A | * | 6/1999 | Check | F24H 3/0488 432/222 |
| 8,764,528 B2 | | 7/2014 | Tresh et al. | |
| 8,833,395 B2 | * | 9/2014 | Weng | F16K 17/048 137/881 |
| 8,914,155 B1 | * | 12/2014 | Shah | H05K 7/20836 700/282 |
| 9,750,164 B2 | | 8/2017 | Roy | |
| 9,888,606 B1 | | 2/2018 | Wendorf et al. | |
| 10,314,206 B1 | | 6/2019 | Shelnutt et al. | |
| 2014/0273792 A1 | * | 9/2014 | Kondo | H05K 7/20836 454/184 |

* cited by examiner

*Primary Examiner* — Mukundbhai G Patel
(74) *Attorney, Agent, or Firm* — Isidore PLLC

(57) ABSTRACT

A data center, an air handling system, and a method for installing equipment in a data center enable internal differential pressure relief within the data center. A volumetric container has mounting location(s) for heat generating information technology (IT) component(s) positioned within the volumetric container. A cold aisle on one side and a hot aisle on another side of the IT component(s) that have air passages for air cooling. A cooling unit is coupled to the volumetric container to pressurize the cold aisle with supply air and draws return air from the hot aisle. An air barrier is attached across an air passage between the cold and the hot aisles. A differential pressure relief mechanism is attached to the air barrier. The differential pressure relief mechanism is configured to open in responses to an air pressure difference across the differential pressure relief mechanism exceeding a pressure threshold.

20 Claims, 7 Drawing Sheets

DATA CENTER HAVING A DIFFERENTIAL PRESSURE RELIEF MECHANISM BETWEEN COLD AND HOT AISLES

BACKGROUND

1. Technical Field

The present disclosure generally relates to data centers and in particular to air handling systems for routing cooling air through modular data centers.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or be configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A modular data center (MDC) contains data center equipment, such as information handling systems (IHSs), storage, and networking equipment, that are typically housed in a container that is transported to a desired location. A modular data center typically also includes power and cooling systems. The data center equipment, such as components of the IHSs, are housed within one or more racks positioned between a cold aisle and a hot aisle of the container. Maintaining a pressure differential between the cold and the hot aisles enables supply air from the cold aisle to passively move through the IHSs to remove excess heat. With the pressure differential, individual IHSs do not require dedicated air movers to cause the supply air to pass through the IHS. Thus, this configuration reduces the cost, power consumption, and noise generated by the IHSs. Situations can arise that cause an increase in the differential pressure within the MDC. Internal doors can become difficult to open or closes if the differential pressure is high. In addition, internal air barriers between the cold and hot aisles, such as meet me room windows, can be damaged due to the differential pressure.

BRIEF SUMMARY

Disclosed are a data center, an air handling system of a data center, and a method for installing equipment in a data center that controls a differential pressure between a cold aisle and a hot aisle within the data center and that prevents the differential pressure from exceeding a pressure threshold.

According to one embodiment, an MDC includes a volumetric container. The MDC includes at least one heat generating information technology (IT) component in a vertically-aligned rack positioned inside the volumetric container. The rack is positioned to provide a separation of an interior space of the volumetric container into a cold aisle on one side of the rack and a hot aisle on another side of the rack. The rack has air passages for air cooling the at least one IT component by allowing supply air to pass from the cold aisle to the hot aisle. An air barrier isolates the supply air within the cold aisle from return air within the hot aisle. The air barrier substantially blocks passage of cooling air between the cold aisle and the hot aisle with the exception of the air passages of the rack that allow the passage of cooling air to cool the at least one IT component. A cooling unit pressurizes the cold aisle with the supply air and draws return air from the hot aisle. A differential pressure relief mechanism is attached to the air barrier. The differential pressure relief mechanism at least partially opens an air passage within a portion of the air barrier in response to an air pressure differential between the cold aisle and the hot aisle exceeding a pressure threshold.

According to another embodiment, an air handling system includes a volumetric container having one or more mounting locations for at least one heat generating IT component in a vertically-aligned rack, positionable inside the volumetric container. The rack is positioned to provide a separation of an interior space of the volumetric container into a cold aisle on one side of the rack and a hot aisle on another side of the rack. The rack has air passages for air cooling the at least one IT component by allowing supply air to pass from the cold aisle to the hot aisle. An air barrier isolates the supply air within the cold aisle from return air within the hot aisle. The air barrier substantially blocks passage of cooling air between the cold aisle and the hot aisle with the exception of the air passages of the rack that allow the passage of cooling air to cool the at least one IT component. A cooling unit pressurizes the cold aisle with the supply air and draws return air from the hot aisle. A differential pressure relief mechanism is attached to the air barrier. The differential pressure relief mechanism at least partially opens an air passage within a portion of the air barrier in response to an air pressure differential between the cold and the hot aisle that exceeds a pressure threshold.

According to an additional embodiment, a method is provided for installing equipment in a data center. The method includes providing a volumetric container having one or more mounting locations for at least one heat generating IT component positioned within the volumetric container. The container includes a cold aisle on one side of the at least one IT component and a hot aisle on another side of the at least one IT component. The at least one IT component has air passages for air cooling that fluidly communicate between the cold and the hot aisles. The method includes coupling a cooling unit to the volumetric container that is operable to pressurize the cold aisle with supply air and to draw return air from the hot aisle. The method includes attaching a differential pressure relief mechanism to an air barrier. The differential pressure relief mechanism is designed (or configured) to open in response to an air pressure difference across the differential pressure relief mechanism exceeding a pressure threshold. The method includes attaching the air barrier across an air passage between the cold and the hot aisles to prevent passage of cooling air from the cold aisle to the hot aisle with the exception of the air passages of the IT rack that cool the at least one IT component.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
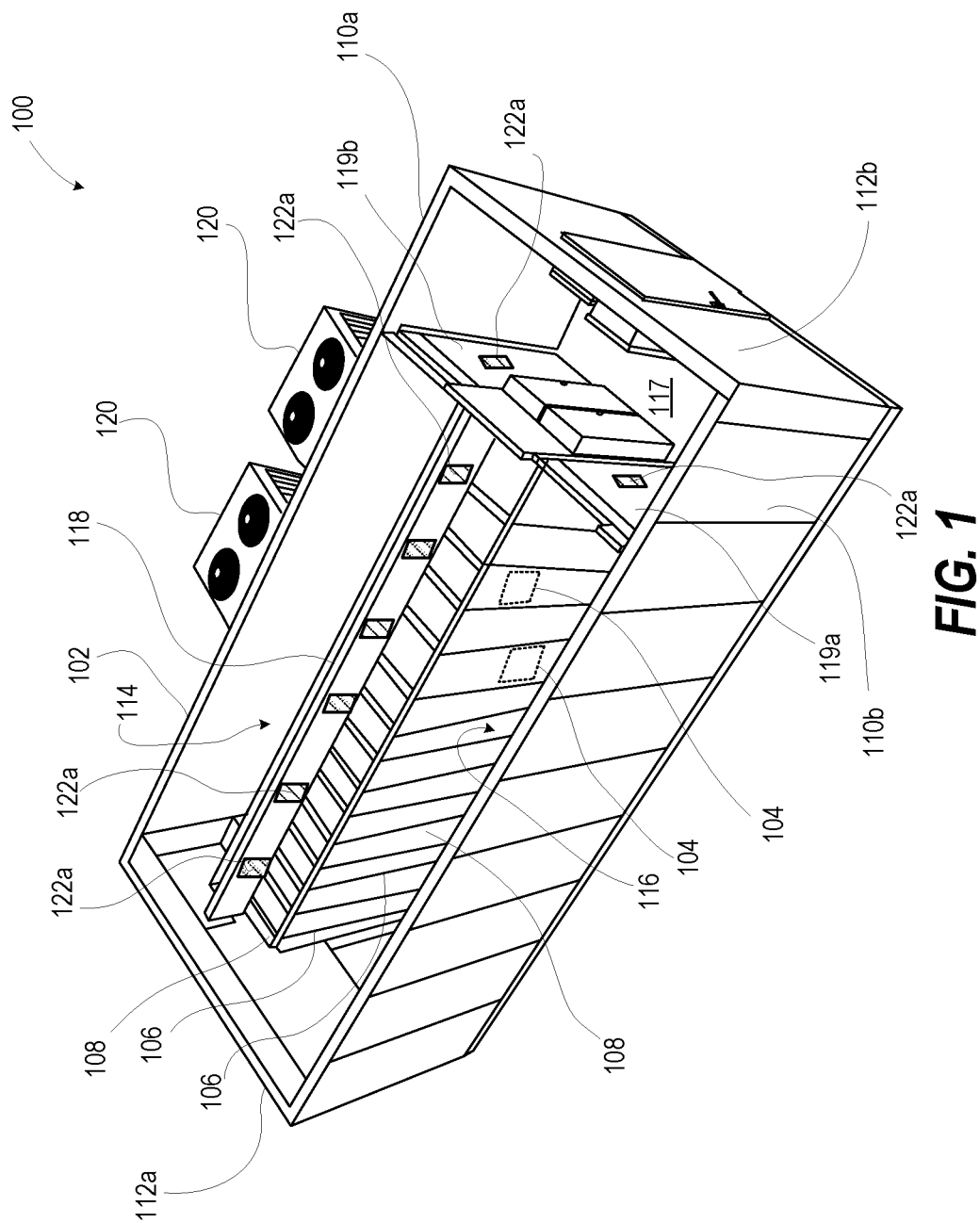
FIG. 1 is a top perspective view of an example modular data center (MDC) having a volumetric container that encloses rack information handling systems (RIHSs) and having differential pressure relief mechanisms, according to one or more embodiments.

The illustrative embodiments provide a data center, an air handling system of a data center, and a method for installing equipment in a data center that provides differential pressure relief between cold and hot aisles. A volumetric container has mounting location(s) for heat generating information technology (IT) component(s) in a vertically-aligned rack placed within the volumetric container. A cold aisle is defined on one side and a hot aisle on another side of the IT component(s). The IT components have air passages for enabling cooling air to move across the IT components from the cold aisle to the hot aisle. A cooling unit is coupled to the volumetric container to pressurize the cold aisle with supply air and draw return air from the hot aisle. An air barrier is attached across at least one air passage between the cold and the hot aisles to prevent direct flow of the cooling air bypassing the IT components. A differential pressure relief mechanism is attached to the air barrier. The differential pressure relief mechanism is configured to open in response to an air pressure difference across the differential pressure relief mechanism exceeding a pressure threshold. The opening of the differential pressure relief mechanism enables proper repositioning of internal doors and to avoid damage to internal components of the MDC due to increased air pressure.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 illustrates a top perspective view of a data center, and in particular example modular data center (MDC) 100, within which one or more of the described features of the various embodiments of the disclosure can be implemented. MDC 100 includes volumetric container 102 that encloses information technology (IT) component(s) 104 in vertically-aligned rack 106. IT component(s) 104 in vertically-aligned rack 106 form rack information handling systems (RIHSs) 108. For purposes of this disclosure, each information handling system, such as RIHSs 108, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2:
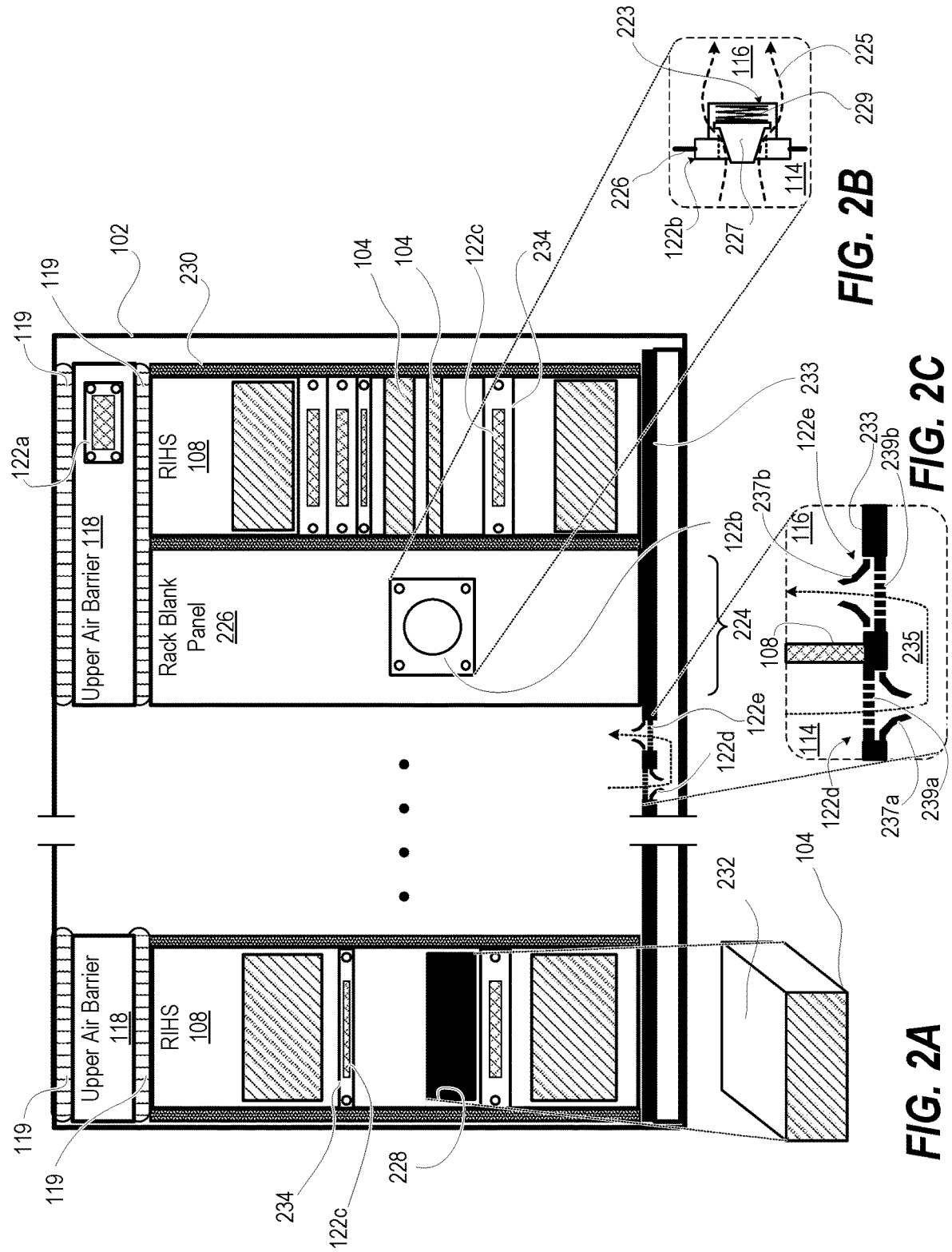
FIG. 2A is a side cutaway view of the example MDC having a longitudinal row of RIHSs with rack-mounted differential pressure relief mechanisms and incorporating a rack blank panel, according to one or more embodiments.
FIG. 2B is an enlarged side cutaway view of the rack blank panel of FIG. 2A and spring-biased differential pressure relief mechanism, according to one or more embodiments.
FIG. 2C is an enlarged side cutaway view of a raised floor of FIG. 2A having differential pressure relief mechanisms, according to one or more embodiments.

In one or more embodiments, volumetric container 102 includes longitudinal exterior walls 110a-b and lateral walls 112a-b. RIHSs 108 are arranged in a longitudinal row, and positioned to provide a separation of an interior space of volumetric container 102 into a cold aisle 114 on one side of RIHSs 108 and a hot aisle 116 on another side of RIHSs 108. Each RIHS 108 includes air passages for air cooling IT component 104 by allowing supply air from cooling units 120 to pass from cold aisle 114 to hot aisle 116 through RIHS 108. An air barrier, such as upper air barrier 118 above RIHSs 108, isolates the supply air within cold aisle 114 from return air within hot aisle 116. Upper air barrier 118 substantially blocks passage of cooling air between cold aisle 114 and hot aisle 116 with the exception of the air passages of the RIHSs 108 used for air cooling IT component 104. Cooling unit(s) 120 pressurizes cold aisle 114 with the supply air and draws return air from hot aisle 116. Differential pressure relief mechanism(s) 122a are attached to (or incorporated into) upper air barrier 118. Differential pressure relief mechanism(s) 122a at least partially opens an air passage within a portion of upper air barrier 118 in response to an air pressure differential between the cold and the hot aisles 114 and 116 exceeding a pressure threshold. Additional details about the pressure threshold are described more particularly be low with reference to FIGS. 2A and 5. In one or more embodiments, another part of volumetric container 102 can be used as an air passage to reduce differential pressure between cold and hot aisles 114, 116. For example, utility room 117 is separated from cold and hot aisles 114, 116 respectively by doors 119a-b. Differential pressure relief mechanisms 122a installed in doors 119a-b provide a pressure relief passage through utility room 117.

In one or more embodiments, a volumetric container can be provided by institutional walled construction of a building erected on site and not be a transportable volumetric container. In one or more embodiments, a data center incorporating differential pressure relief mechanisms can include both modular volumetric containers and building volumetric containers for various portions of the data center.

FIG. 2A depicts a side cutaway view of the longitudinal row of RIHSs 108 positioned in volumetric container 102 that includes air barriers with differential pressure relief mechanisms 122a-c. As shown, rack spaces 224 that do not contain an RIHS are blocked with an air barrier referred herein as rack blank panel 226. Rack blank panel 226 includes differential pressure relief mechanism 122b. Air seals 119 are provided at the top and bottom connection of upper air barrier 118 to prevent or substantially minimize passing of cooling or heated air over or under upper air barrier 118.

FIG. 2B depicts an enlarged side cutaway view of rack blank panel 226 and differential pressure relief mechanism 122b. In one or more embodiments, rack blank panel 226 is a panel formed of sheet metal having peripherally placed fastener holes for mounting to volumetric container 102. Differential pressure relief mechanism 122b includes spring-biased actuator 223 that at least partially opens to allow air 225 from cold aisle 114 (FIG. 1) to pass around the spring-biased actuator 223 to reach hot aisle 116 (FIG. 1) in response to differential pressure exceeding a threshold. The actuating pressure can be selected during design based on exposed frontal area of actuator cone 227 and strength of compression spring 229.

With continuing reference to FIG. 2A, RIHSs 108 can include vertical or horizontal slots 228 that receive IT components 104. Slot 228 can be standardized into rack units (RUs) such that IT components 104 can be 1RU, 2RU, etc., in height. Vertical supports 230 are part of rack 106 and can include substantially open areas enabling selected heights of IT components 104 to be inserted. Generally, IT components 104 have a tray or chassis 232 that is rectangular shape that matches one or more slots 228. Slot 228 that does not contain IT component 104 can be covered by rack slot cover 234 sized for a rectangular opening and that includes differential pressure relief mechanism 122c. The rack slot cover 234 blocks cooling air that would otherwise flow unobstructed through a relatively large air passage without cooling any IT components 104. Differential pressure relief mechanism 122c allows air to pass from cold aisle 114 to hot aisle 116 through rack slot cover 234 when differential pressure exceeds the threshold.

FIG. 2C is an enlarged side cutaway view of raised floor 233 of FIG. 2A having differential pressure relief mechanisms 122d-e. In one or more embodiments, raised floor 233 provides an additional air barrier between cold and hot aisles 114, 116. In cold aisle 114 (FIG. 1), differential pressure relief mechanism 122d includes resilient flaps 237a that have a non-actuated position that closes grate 239a in raised floor 233. The resiliency of the flaps 237a provides a restoring force for flattening out to a closed position. Grate 239a above the resilient flaps 237a prevents the flaps 237a of differential pressure relief mechanism 122d from opening upward in response to higher air pressure in floor air passage 235 than cold aisle 114. In hot aisle 116, differential pressure relief mechanism 122e includes resilient flaps 237b that have a non-actuated position that closes grate 239b in raised floor 233. Grate 239b below resilient flaps 237b prevents resilient flaps 237b from opening downward in response to lower air pressure in floor air passage 235 than hot aisle 116. Both differential pressure relief mechanisms 122d-e open in response to a positive differential pressure between cold and hot aisles 114, 116 (FIG. 1) that exceeds a preset threshold. In one or more embodiments, the number and the type of differential pressure relief mechanisms as well as the locations are limited. For example, only differential pressure relief mechanisms 122a installed in one of three upper air barriers 118 (FIG. 1). For another example, a data center may only use differential pressure relief mechanisms 122d-e.

Figure 3:
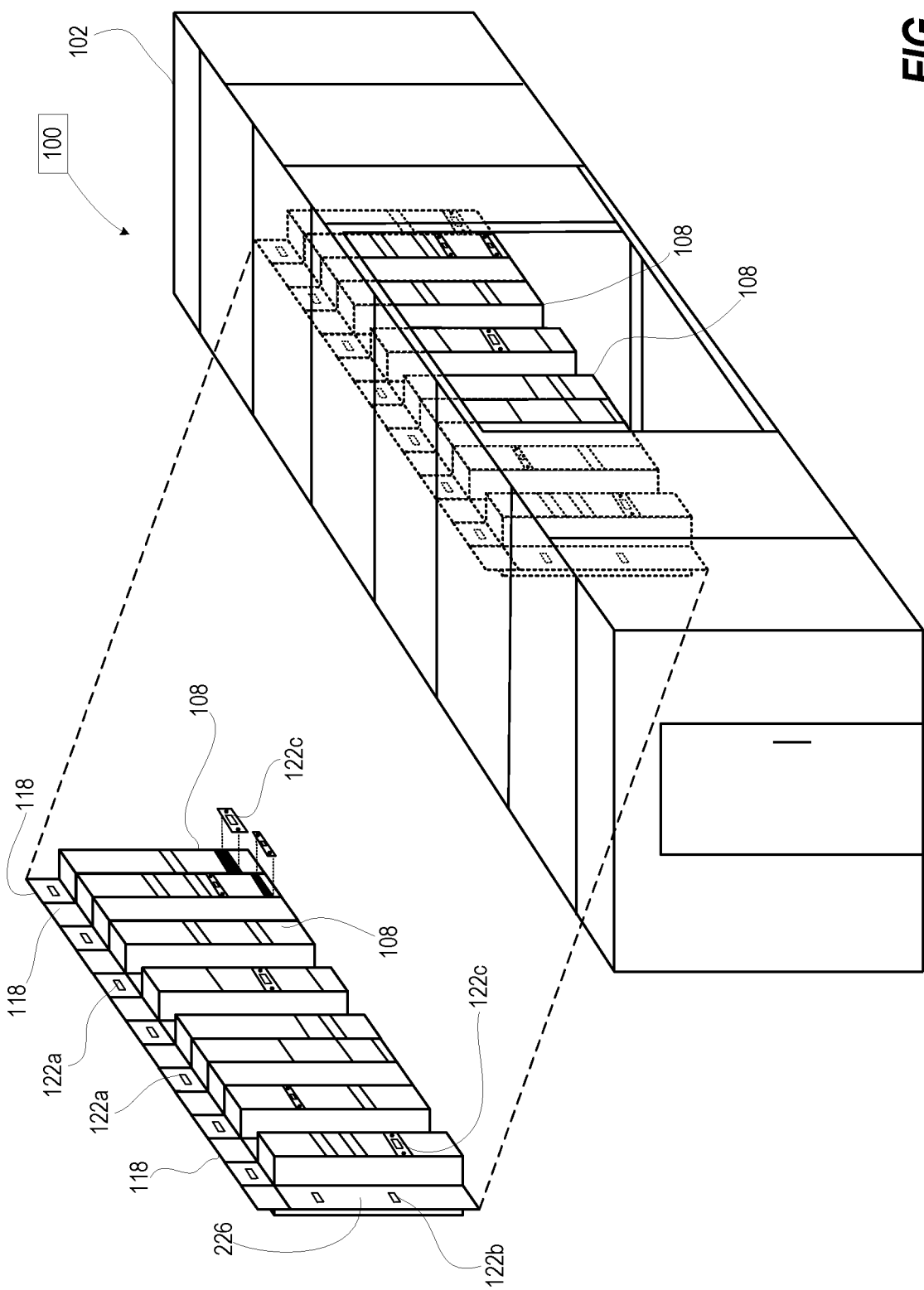
FIG. 3 is a three-dimensional view of the longitudinal row of RIHSs and rack-mounted differential pressure relief mechanisms installed in the volumetric container of the example MDC, according to one or more embodiments.

FIG. 3 depicts a three-dimensional view of example MDC 100 having a longitudinal row of RIHSs 108 with upper air barriers 118 positioned in volumetric container 102. Each of the differential pressure relief mechanisms 122a-c respond to differential pressure exceeding a threshold.

Figure 4:
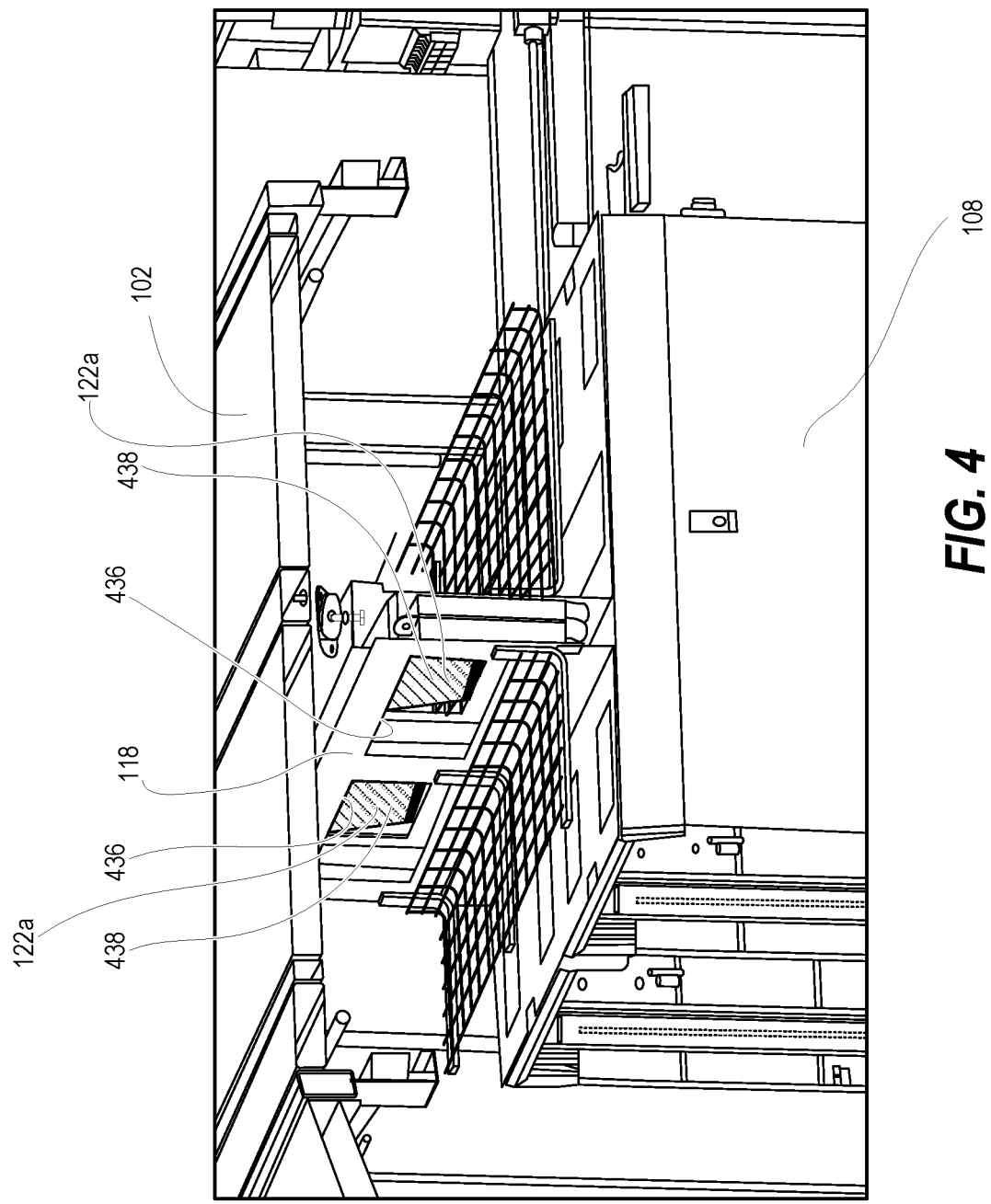
FIG. 4 is an enlarged perspective view of an upper portion of RIHSs coupled to the volumetric container by an upper air barrier having differential pressure relief mechanisms, according to one or more embodiments.

FIG. 4 depicts an enlarged perspective view of an upper portion of RIHS 108 coupled to volumetric container 102 by upper air barrier 118. In one or more embodiments, upper air barrier 118 is configured to also provide structural support to RIHS 108 against vibration and seismic activity. Differential pressure relief mechanisms 122a are attached across a top edge of air passages 436. Weighted flap 438 of differential pressure relief mechanisms 122a has a closed position that blocks air flow through a corresponding air passage 436. With differential pressure above a threshold pressure, weighted flap 438 at least partially opens. In one or more embodiment, upper air barriers 118 are structural components that provide shock isolation and vibration damping (SIVD). Upper air barriers 118 are attached to (i.e., fastened, screwed, welded or adhered to) a top surface of RIHS 108 via L-shaped brackets or other connecting mechanisms. Upper air barriers 118 are also fastened to structural components (e.g., a top beam or ceiling) of an upper portion of volumetric container 102. Air seals 119 (FIG. 2A) are provided at the top and bottom connection of upper air barrier 118 to prevent or substantially minimize passing of cooling or heated air over or under upper air barrier 118. The seal can be mechanical, with the attachment of upper air barrier 118 completed using screws or similar non-permanent attachment to enable the air barrier to be removed/separated from the RIHS at a later time if either the air barrier 118 or connected rack has to be changed.

In one or more alternate embodiments, upper air barrier 118 can be a thin two-dimensional panel that does not provide structural support to RIHSs 108. Upper air barrier 118 (and other air barriers utilized within RIHS, rack black panel, etc.) can be made of sheet metal and/or a variety of other types of materials that can support the difference in air pressure within the volumetric container 102 without buckling or loosing structural integrity.

Figure 5:
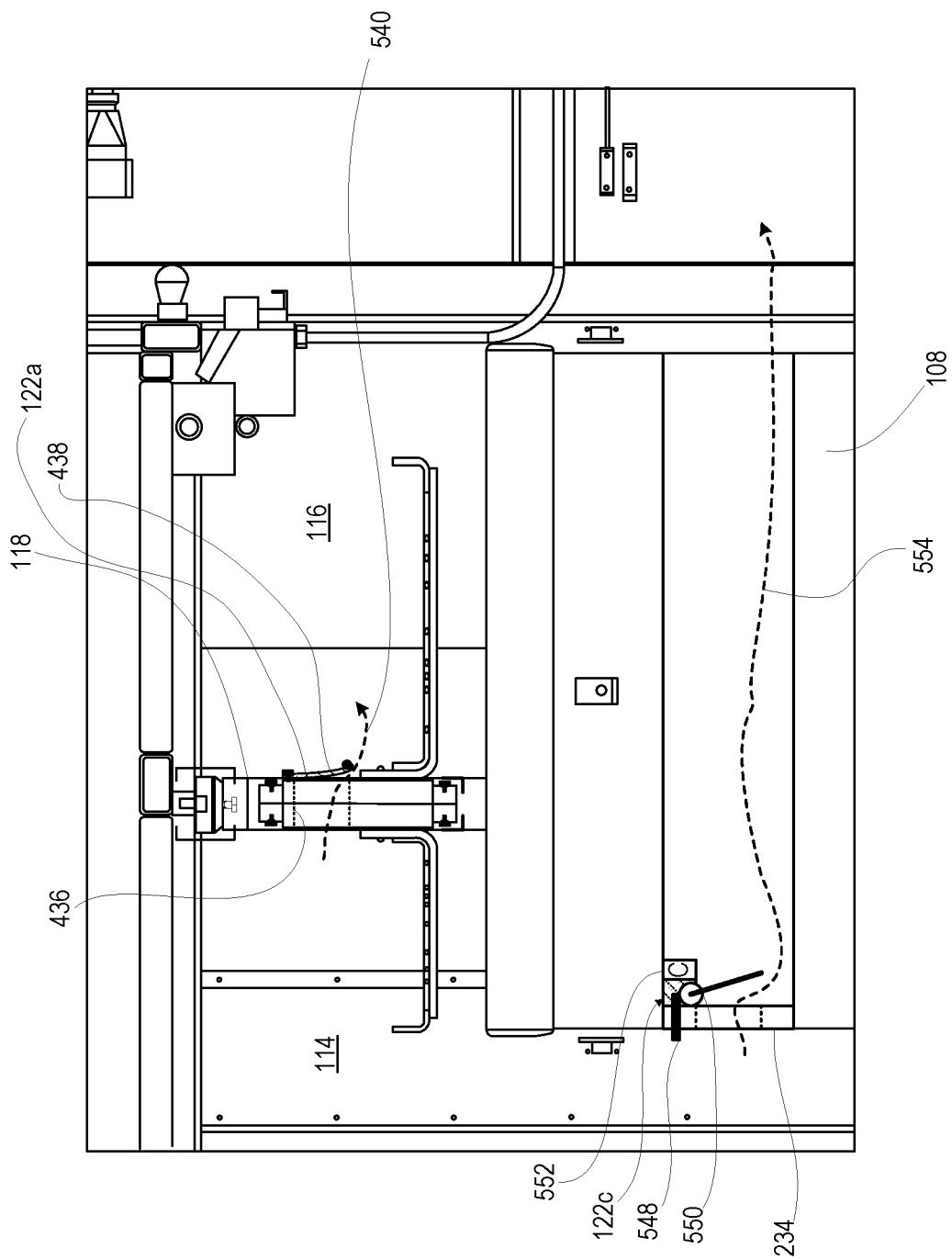
FIG. 5 is a side cutaway view of the upper portion of the longitudinal row of RIHS with differential pressure relief mechanisms attached to an upper air barrier and a rack slot cover, according to one or more embodiments.

FIG. 5 depicts a side cutaway view of the upper portion of RIHS 108 having differential pressure relief mechanisms 122a, c that each close with a different type of device, including: (i) gravity closed devices; (ii) spring closed devices; and (iii) and actively-controlled electrically closed devices. One end of weighted flap 438 of differential pressure relief mechanism 122a is attached to upper air barrier 118 and is thus stationary, while the opposite end is movable. The moveable end deflects outward towards hot aisle 116 in response to an increase in the cooling air pressure (impacting on the surface of the weighted flap 438) within cold aisle 114 above a pressure threshold. The outward deflection allows air 540 to pass from cold aisle 114 to hot aisle 116. The amount of deflection can be proportional to the air pressure impacting the weighted flap 438, in one or more embodiments, while the amount of deflection can be the same, irrespective of the amount of pressure, in other embodiments.

Differential pressure relief mechanism 122c includes pressure sensor 548 that detects a differential pressure between the cold and the hot aisles 114, 116. Pressure sensor 548 can be a transducer that is polled to receive a current air differential pressure value that is compared to a programmed pressure threshold. Pressure sensor 548 can be a pressure switch that provides a binary output depending on whether a mechanically moved sensing actuator responds to a pressure that exceeds a mechanically built-in threshold. Differential pressure relief mechanism 122c also includes electrically-actuated louver 550, and controller 552, which is communicatively coupled to pressure sensor 548 and electrically-actuated louver 550. Controller 552 responds to pressure sensor 548 detecting a differential pressure that exceeds a pressure threshold by electrically opening electrically-actuated louver 550 to allow air 554 to pass from cold aisle 114 to hot aisle 116. In one embodiment, controller 552 maintains the open state of electrically-actuated louver 550 until the differential pressure sensed by pressure sensor 548 falls to within an acceptable range of or below the pressure threshold. Cooling requirements due to high ambient outside temperatures and/or high computing loads can require use of higher differential pressures in order to carry away excess heat. In one or more embodiments, an air handling system controller (not shown) can communicate an increased level of the pressure threshold to controller 552 to support this cooling requirement.

Figure 6A:
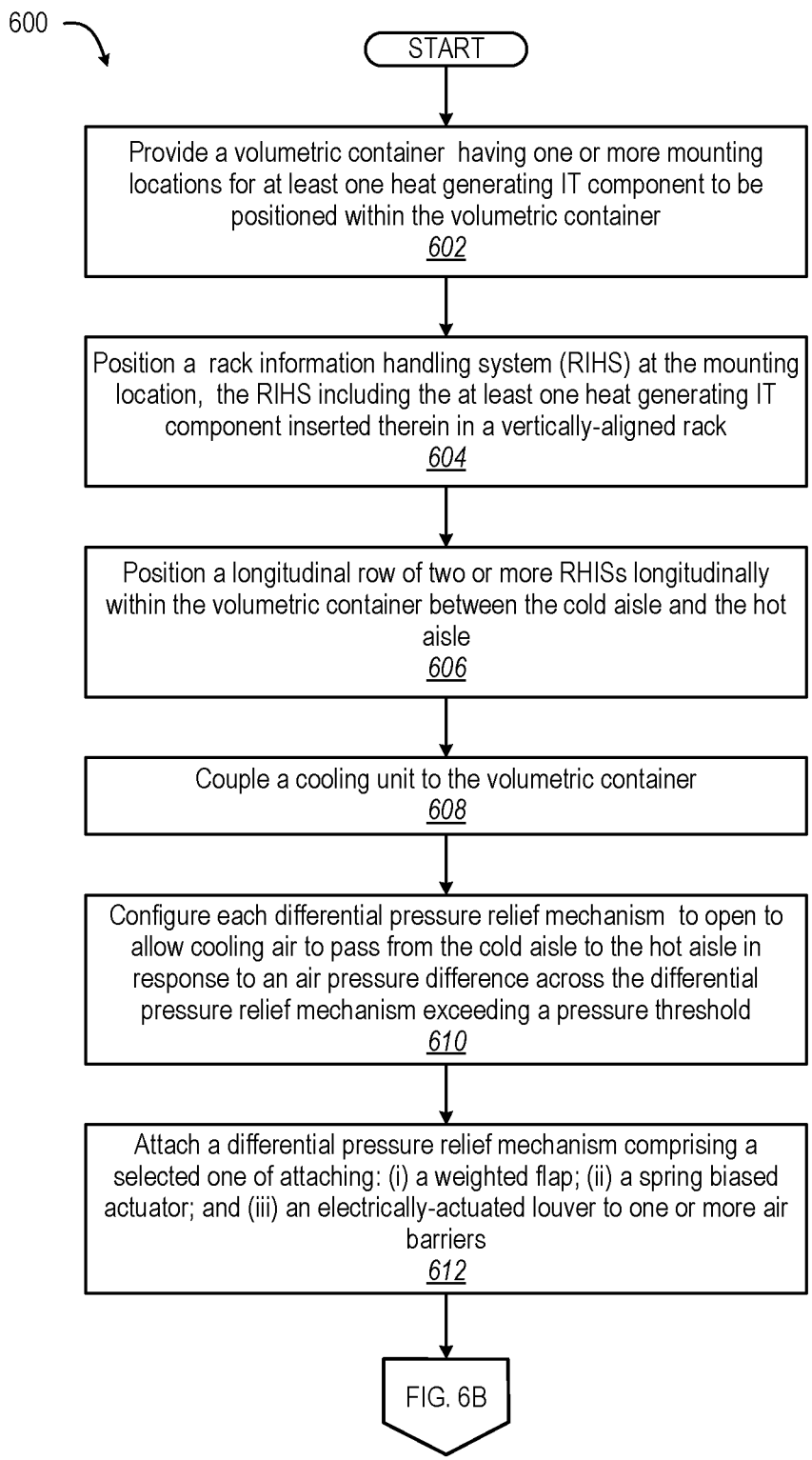
FIGS. 6A-B are a flow diagram of a method for installing equipment in a data center that is configured with differential pressure mechanisms to relieve excess differential pressure between cold and hot aisles of the MDC, according to one or more embodiments.
Figure 6B:
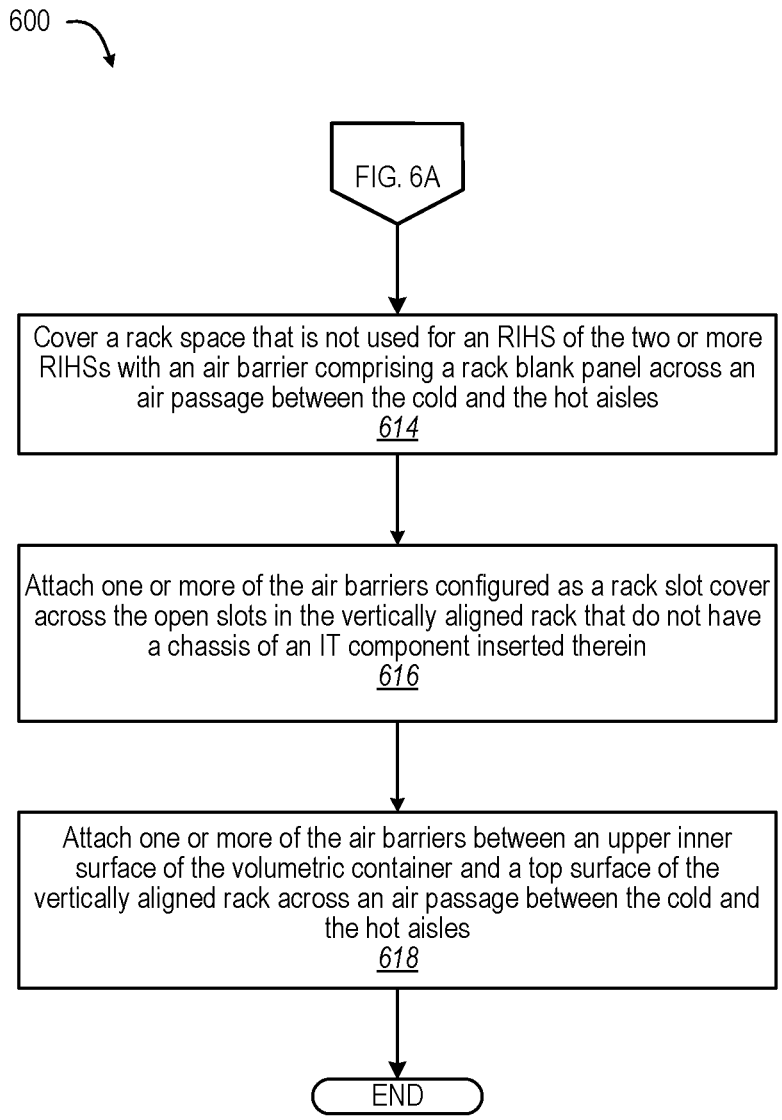

FIGS. 6A-B illustrate a flowchart of an exemplary method 600 for assembling an MDC that includes mechanisms for relieving excess differential pressure between cold and hot aisles, such as MDC 100 (FIG. 1) of the preceding figures. MDC 100 relieves excess differential pressure between cold and hot aisles of the MDC using the different functional and/or mechanical features described above. The description of method 600 is provided with general reference to the specific components illustrated within the preceding FIGS. 1-5. In one or more embodiments, method 600 can be implemented using automated assembly equipment or machines that are at least partially controlled by a controller or IHS. With specific reference to FIG. 6A, method 600 includes providing a volumetric container having one or more mounting locations for at least one heat generating IT component to be positioned within the volumetric container (block 602). Method 600 includes positioning a rack information handling system (RIHS) at the mounting location, the RIHS including the at least one heat generating IT component inserted therein in a vertically-aligned rack (block 604). In one or more embodiments, the rack is pre-assembled with one or more IT components prior to placement in the volumetric container. In one or more embodiments, the rack is installed in the volumetric container prior to being loaded with one or more IT components. A cold aisle is defined on one side of the at least one IT component and a hot aisle is defined on another side of the at least one IT component. The at least one IT component has air passages for air cooling for fluidly communicating cooling air between the cold and the hot aisles. In one or more embodiments, method 600 includes positioning a longitudinal row of two or more RHISs within the volumetric container between the cold aisle and the hot aisle (block 606). The vertically aligned rack has more than one slot sized to horizontally receive a chassis of a respective one of the at least one IT components. Method 600 includes coupling a cooling unit to the volumetric container (block 608). The cooling unit is operable to pressurize the cold aisle with supply air and to draw return air from the hot aisle. Method 600 includes configuring each differential pressure relief mechanism to open to allow cooling air to pass from the cold aisle to the hot aisle in response to an air pressure difference across the differential pressure relief mechanism exceeding a pressure threshold (block 610) Method 600 includes attaching a differential pressure relief mechanism to one or more air barriers (block 612). Attaching the differential pressure relief mechanism can include attaching one or more of: (i) a weighted flap; (ii) a spring biased actuator; and (iii) an electrically-actuated louver.

With reference to FIG. 6B, method 600 includes covering, with a rack blank panel, any open rack spaces within the volumetric container that are not being populated with an RIHS (block 614). The rack space is covered with the rack blank panel, which serves as an air barrier extending across (to block) an air passage between the cold and the hot aisles. Method 600 includes attaching one or more of the air barriers configured as a rack slot cover across the open slots in the vertically aligned rack that do not have a chassis of an IT component inserted therein (block 616). Method 600 includes attaching one or more of the air barriers between an upper inner surface of the volumetric container and a top surface of the vertically aligned rack across an upper air passage between the cold and the hot aisles (block 618). Then method 600 ends.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain or store a program for use by or in connection with an instruction execution system, apparatus, or device.

While the disclosure has been described with reference to exemplary embodiments, it will be understood by those skilled in the art that various changes may be made, and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A data center comprising:
a volumetric container;
at least one heat generating information technology (IT) component in a vertically-aligned rack positioned inside the volumetric container, the rack positioned to provide a separation of an interior space of the volumetric container into a cold aisle on one side of the rack and a hot aisle on another side of the rack, the rack having air passages for air cooling the at least one IT component by allowing supply air to pass from the cold aisle to the hot aisle;
at least one air barrier that isolates the supply air within the cold aisle from return air within the hot aisle, the at least one air barrier substantially blocking passage of cooling air between the cold and the hot aisle with the exception of the air passages of the rack that air cool the at least one IT component;
a cooling unit that pressurizes the cold aisle with the supply air and draws return air from the hot aisle;
a raised floor serving as an additional air barrier between the cold and the hot aisle; and
a differential pressure relief mechanism attached to an opening within the air barrier and that at least partially opens an air passage within a portion of the air barrier to move a portion of the supply air from the cold aisle directly into the hot aisle in response to an air pressure differential between the cold and the hot aisle that exceeds a pressure threshold, where an air pressure of the cold aisle is higher than an air pressure of the hot aisle, the differential pressure relief mechanism comprising at least one weighted flap attached to the raised floor, comprising a first weighted flap extended atop a first grate within the raised floor and a second weighed flap extended below a second grate within the raised floor, the first weighted flap opening upwards and the second weight flap opening downwards in response to respective ones of positive differential pressure between the cold aisle and the hot aisle.

2. The data center of claim 1, wherein the differential pressure relief mechanism comprises a spring biased actuator and a rack blank panel having the spring biased actuator attached thereto, the spring biased actuator at least partially opens to allow air from the cold aisle to pass around the spring-biased actuator to reach the hot aisle in response to differential pressure exceeding a threshold, the actuating pressure based on exposed frontal area of an actuator cone and a strength of a compression spring of the spring biased actuator.

3. The data center of claim 1, wherein the differential pressure relief mechanism further comprises:
a pressure sensor, which detects a differential pressure between the cold and the hot aisles, the pressure sensor being one of (i) a transducer that is polled to receive a current air differential pressure value that is compared to a programmed pressure threshold and (ii) a pressure switch that provides a binary output depending on whether a mechanically moved sensing actuator responds to a pressure that exceeds a mechanically built-in threshold;
an electrically-actuated louver within the at least one air barrier; and
a controller communicatively coupled to the pressure sensor and the electrically-actuated louver, the controller responsive to the pressure sensor detecting a differential pressure that exceeds a pressure threshold to electrically open the electrically-actuated louver to allow air to pass from the cold aisle to the hot aisle.

4. The data center of claim 1, wherein:
the volumetric container has a first longitudinal side providing the cold aisle, and the volumetric container has a second longitudinal side providing the hot aisle;
the at least one heat generating information technology (IT) component in the vertically-aligned rack comprises a longitudinal row of two or more rack information handling systems (RIHSs) each comprising at least one heat generating IT component in a vertically aligned rack and positioned longitudinally within the volumetric container between the cold aisle and the hot aisle; and
the volumetric container comprises a utility room that is separated from cold and hot aisles respectively by doors having respective differential pressure relief mechanisms installed therein to provide a pressure relief passage through the utility room.

5. The data center of claim 1, wherein the at least one air barrier comprises a rack blank panel that covers a rack space that does not have a vertically-aligned rack extending vertically between the hot aisle and the cold aisle.

6. The data center of claim 1, wherein:
each of the at least one heat generating IT component comprises a chassis;
the vertically aligned rack comprises more than one slot sized to horizontally receive a chassis of a respective one of the at least one IT component; and
the air barrier comprises a rack slot cover attachable to vertically aligned rack to block at least one of the slots of the more than one slot that is not used for a chassis.

7. The data center of claim 1, wherein the at least one air barrier extends between an upper inner surface of the volumetric container and a top surface of the vertically aligned rack and is fastened to a structural component of an upper portion of the volumetric container, the data center further comprising air seals provided at a top and a bottom connection of the at least one air barrier to minimize passing of cooling or heated air over or under the at least one air barrier.

8. An air handling system comprising:
a volumetric container having one or more mounting locations for at least one heat generating information technology (IT) component in a vertically-aligned rack positionable inside the volumetric container, the rack positioned to provide a separation of an interior space of the volumetric container into a cold aisle on one side of the rack and a hot aisle on another side of the rack, the rack having air passages for air cooling the at least one IT component by allowing supply air to pass from the cold aisle to the hot aisle;
at least one air barrier that isolates the supply air within the cold aisle from return air within the hot aisle, the at least one air barrier substantially blocking passage of cooling air between the cold and the hot aisle with the exception of the air passages of the rack that air cool the at least one IT component;

a cooling unit that pressurizes the cold aisle with the supply air and draws return air from the hot aisle;

a raised floor serving as an additional air barrier between the cold aisle and the hot aisle; and a differential pressure relief mechanism attached to the air barrier and that at least partially opens an air passage within a portion of the air barrier to move a portion of the supply air from the cold aisle directly into the hot aisle in response to an air pressure differential between the cold and the hot aisle that exceeds a pressure threshold, where an air pressure of the cold aisle is higher than an air pressure of the hot aisle, the differential pressure relief mechanism comprising at least one weighted flap attached to the raised floor, comprising a first weighted flap extended atop a first grate within the raised floor and a second weighed flap extended below a second grate within the raised floor, the first weighted flap opening upwards and the second weight flap opening downwards in response to respective ones of positive differential pressure between the cold aisle and the hot aisle.

9. The air handling system of claim 8, wherein the first weighted flap opens into the hot aisle when a pressure of the cold aisle is greater than a hot aisle air pressure by at least the pressure threshold.

10. The air handling system of claim 8, wherein the differential pressure relief mechanism comprises a spring biased actuator that at least partially opens to allow air from the cold aisle to pass around the spring-biased actuator to reach the hot aisle in response to differential pressure exceeding a threshold, the actuating pressure based on exposed frontal area of an actuator cone and a strength of a compression spring of the spring biased actuator.

11. The air handling system of claim 8, wherein the differential pressure relief mechanism comprises:

a pressure sensor, which detects a differential pressure between the cold and the hot aisles, the pressure sensor being one of (i) a transducer that is polled to receive a current air differential pressure value that is compared to a programmed pressure threshold and (ii) a pressure switch that provides a binary output depending on whether a mechanically moved sensing actuator responds to a pressure that exceeds a mechanically built-in threshold;

an electrically-actuated louver; and a controller communicatively coupled to the pressure sensor and the electrically-actuated louver, the controller responsive to the pressure sensor detecting a differential pressure that exceeds a pressure threshold to electrically open the electrically-actuated louver.

12. The air handling system of claim 8, wherein:

the volumetric container has a first longitudinal side providing the cold aisle, and the volumetric container has a second longitudinal side providing the hot aisle; and the at least one heat generating information technology (IT) component in the vertically-aligned rack comprises a longitudinal row of two or more rack information handling systems (RHISs) each comprising at least one heat generating IT component in a vertically aligned rack and positioned longitudinally within the volumetric container between the cold aisle and the hot aisle.

13. The air handling system of claim 12, wherein the at least one air barrier comprises a rack blank panel that covers a rack space that is not used for an RIHS of the two or more RIHSs.

14. The air handling system of claim 8, wherein:

each of the at least one heat generating IT component comprises a chassis;

the vertically aligned rack comprises more than one slot sized to horizontally receive a chassis of a respective one of the at least one IT component; and the air barrier comprises a rack slot cover attachable to vertically aligned rack to block at least one of the slots of the more than one slot that is not used for a chassis.

15. The air handling system of claim 8, wherein the at least one air barrier extends between an upper inner surface of the volumetric container and a top surface of the vertically aligned rack and is fastened to a structural component of an upper portion of the volumetric container, the air handling system further comprising air seals provided at a top and a bottom connection of the at least one air barrier to minimize passing of cooling or heated air over or under the at least one air barrier.

16. A method for installing equipment in a data center, the method comprising:

providing a volumetric container having one or more mounting locations for at least one heat generating information technology (IT) component positioned within the volumetric container, a cold aisle on one side of the at least one IT component and a hot aisle on another side of the at least one IT component, the at least one IT component having air passages for air cooling that communicate fluidly between the cold and the hot aisles;

coupling a cooling unit to the volumetric container that is operable to pressurize the cold aisle with supply air and to draw return air from the hot aisle;

providing a raised floor serving as an additional air barrier between the cold and the hot aisle;

attaching a plurality of differential pressure relief mechanisms to respective air barriers, each of the plurality of differential pressure relief mechanisms configured to open to allow movement of a portion of the supply air from the cold aisle directly into the hot aisle in response to an air pressure difference across the differential pressure relief mechanism exceeding a pressure threshold, where an air pressure of the cold aisle is higher than an air pressure of the hot aisle, the plurality of differential pressure relief mechanisms comprising: (i) a weighted flap that extends across an opening between the cold aisle and the hot aisle and opens into the hot aisle when a pressure of the cold aisle is greater than a hot aisle air pressure by at least the pressure threshold, the weighted flap comprising a first weighted flap extended atop a first grate within the raised floor and a second weighed flap extended below a second grate within the raised floor, the first weighted flap opening upwards and the second weight flap opening downwards in response to respective ones of positive differential pressure between the cold aisle and the hot aisle; and attaching the air barriers across open air passages between the cold and the hot aisles.

17. The method of claim 16, further comprising:

providing the volumetric container including a first longitudinal side providing the cold aisle and including a second longitudinal side providing the hot aisle;

positioning a longitudinal row of two or more rack information handling systems (RHISs) longitudinally within the volumetric container between the cold aisle and the hot aisle, each RIHS comprising at least one heat generating IT component in a vertically aligned rack; and covering a rack space that is not used for an RIHS of the two or more RIHSs with the air barrier comprising a rack blank panel.

18. The method of claim 17, further comprising positioning, in the volumetric container, the vertically aligned rack having more than one slot sized to horizontally receive a chassis of a respective one of the at least one IT component, wherein attaching the air barrier comprises a selected one or more of:

attaching a rack slot cover to the vertically aligned rack to block at least one of the slots of the more than one slot that is not used for a chassis of IT components; and attaching the at least one air barrier between an upper inner surface of the volumetric container and a top surface of the vertically aligned rack.

19. The method of claim 16, the plurality of differential pressure relief mechanisms further comprising a spring biased actuator that at least partially opens to allow air from the cold aisle to pass around the spring-biased actuator to reach the hot aisle in response to differential pressure exceeding a threshold, the actuating pressure based on exposed frontal area of an actuator cone and a strength of a compression spring of the spring biased actuator.

20. The method of claim 16, the plurality of differential pressure relief mechanisms further comprising: (a) an electrically-actuated louver; and (b) a pressure sensor, which detects a differential pressure between the cold and the hot aisles, the pressure sensor being one of (i) a transducer that is polled to receive a current air differential pressure value that is compared to a programmed pressure threshold and (ii) a pressure switch that provides a binary output depending on whether a mechanically moved sensing actuator responds to a pressure that exceeds a mechanically built-in threshold, the method further comprising communicatively coupling a controller to the pressure sensor and to the electrically-actuated louver, the controller responsive to the pressure sensor detecting a differential pressure that exceeds a pressure threshold to electrically open the electrically-actuated louver.

* * * * *